(12) United States Patent
Pinos et al.

(10) Patent No.: US 12,278,257 B2
(45) Date of Patent: Apr. 15, 2025

(54) LIGHT EMITTING DIODE AND METHOD OF FORMING A LIGHT EMITTING DIODE

(71) Applicant: PLESSEY SEMICONDUCTORS LIMITED, Plymouth (GB)

(72) Inventors: Andrea Pinos, Plymouth (GB); Simon Ashton, Plymouth (GB); Samir Mezouari, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 429 days.

(21) Appl. No.: 17/637,597

(22) PCT Filed: Sep. 1, 2020

(86) PCT No.: PCT/EP2020/074297
§ 371 (c)(1),
(2) Date: Feb. 23, 2022

(87) PCT Pub. No.: WO2021/043745
PCT Pub. Date: Mar. 11, 2021

(65) Prior Publication Data
US 2022/0278166 A1     Sep. 1, 2022

(30) Foreign Application Priority Data

Sep. 6, 2019    (GB) .................................... 1912853

(51) Int. Cl.
*H01L 27/15*     (2006.01)
*H01L 33/00*     (2010.01)
*H01L 33/32*     (2010.01)

(52) U.S. Cl.
CPC ........ *H01L 27/156* (2013.01); *H01L 33/0066* (2013.01); *H01L 33/32* (2013.01)

(58) Field of Classification Search
CPC ................... H01L 27/156; H01L 27/15; H01L 33/0066; H01L 33/32; H01L 33/0075; H01L 33/08;
(Continued)

(56) References Cited

U.S. PATENT DOCUMENTS 5,128,276 A   7/1992  Ambrosius et al.
9,666,677 B1  5/2017  Raring et al.
(Continued)

FOREIGN PATENT DOCUMENTS

JP    2002185084 A    6/2002
JP    2004111689 A    4/2004
(Continued)

OTHER PUBLICATIONS

International Search Report, PCT/EP2020/074297, dated Nov. 12, 2020, 4 pages.
(Continued)

*Primary Examiner* — Amar Movva
*Assistant Examiner* — Sandra M Rodriguez Villanueva
(74) *Attorney, Agent, or Firm* — Stinson LLP

(57) ABSTRACT

A method of forming a Light Emitting Diode (LED) precursor comprising: forming a first semiconducting layer comprising a Group III-nitride on a substrate, selectively removing a portion of the first semiconducting layer to form a mesa structure, and forming a monolithic LED structure. According to the method, the first semiconducting layer has a growth surface on an opposite side of the first semiconducting layer to the substrate. According to the method, the first semiconducting layer is selectively removed to form the mesa structure such that the growth surface of the first semiconducting layer comprises a mesa surface and a bulk semiconducting surface. Further, the monolithic LED structure is formed on the growth surface of the first semiconducting layer such that the monolithic LED structure covers the mesa surface and the bulk semiconducting surface, the monolithic LED structure comprising a plurality of layers, each layer comprising a Group III-nitride, including a second semiconducting layer, an active layer provided on the second semiconducting layer, the active layer configured to generate light, and a p-type semiconducting layer provided on the active layer. A potential barrier is provided between a first portion of the p-type semiconducting layer covering the mesa surface and a second portion of the p-type semiconducting layer covering the bulk semiconducting surface.

(Continued)

The potential barrier surrounds the first portion of the p-type semiconducting layer covering the mesa surface.

17 Claims, 6 Drawing Sheets

(58) Field of Classification Search
CPC ..... H01L 33/20; H01L 33/007; H01L 33/145; H01L 33/0025; H01L 33/30; H01L 33/00
See application file for complete search history.

(56) References Cited

U.S. PATENT DOCUMENTS

| | | | |
|---|---|---|---|
| 2009/0072253 A1 | 3/2009 | Karino et al. | |
| 2010/0330717 A1* | 12/2010 | Choi | H01L 33/20 257/E33.067 |
| 2011/0101414 A1 | 5/2011 | Thompson et al. | |
| 2011/0263054 A1 | 10/2011 | Yu et al. | |
| 2016/0336483 A1* | 11/2016 | Shatalov | H01L 33/32 |
| 2017/0170360 A1 | 6/2017 | Bour et al. | |
| 2018/0198047 A1 | 7/2018 | Danesh et al. | |
| 2019/0058084 A1 | 2/2019 | Piao | |
| 2019/0067520 A1 | 2/2019 | Sakai et al. | |

FOREIGN PATENT DOCUMENTS

| | | |
|---|---|---|
| JP | 2010245378 | 10/2010 |
| WO | 2018204402 A1 | 11/2018 |

OTHER PUBLICATIONS

Written Opinion, PCT/EP2020/074297, dated Nov. 12, 2020, 6 pages.
Search Report for Taiwanese Application No. 109129679, dated Aug. 21, 2020, 9 pages.
Great Britain Search Report, GB1912853.7, dated Feb. 11, 2020, 7 pages.
Abstract of TW201421729; Jun. 1, 2014.

* cited by examiner

LIGHT EMITTING DIODE AND METHOD OF FORMING A LIGHT EMITTING DIODE

REFERENCE TO RELATED APPLICATIONS

This application is the 371 U.S. national stage application of International Patent Application No. PCT/EP2020/074297, filed Sep. 1, 2020, which claims the benefit of Great Britain Patent Application No. 1912853.7, filed Sep. 6, 2019, the entire disclosures of which are incorporated herein by reference.

FIELD OF THE DISCLOSURE

The present disclosure relates to Group III-nitride semiconductors. In particular, the present disclosure relates to Light Emitting Diodes (LEDs) comprising Group III-nitride semiconductors.

BACKGROUND

Micro LED arrays are commonly defined as arrays of LEDs with a size of 100×100 µm² or less. Micro LED arrays are a self-emitting component in a micro-display/projector which are suitable for use in a variety of devices such as smartwatches, head-wearing displays, head-up displays, camcorders, viewfinders, multisite excitation sources, and pico-projectors.

One type of micro LED array comprises a plurality of LEDs formed from Group III-nitrides. Group III-nitride LEDs are inorganic semiconductor LEDs comprising, for example, GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from, high brightness. For example, applications which benefit from high brightness may include displays in high brightness environments or projectors. Additionally, Group III-nitride micro LED arrays are known to have relatively high luminous efficacy, expressed in lumens per watt (lm/W) compared to other conventional large area LEDs. The relatively high luminous efficacy of Group III-nitride micro LED arrays reduces power usage compared with other light sources and makes micro LEDs particularly suitable for portable devices.

One method for forming micro LEDs, in particular, micro LED arrays, from Group III-nitrides is selective area growth (SAG), such as described in U.S. Pat. No. B-7,087,932. In the selective area growth technique, a mask is patterned on a buffer layer. The material in the mask is such that the at the growth conditions, no additional material is grown directly on the mask but only inside apertures exposing portions of the surface of the underlying buffer layer. Another noteworthy feature of selective area growth of Group III-nitrides grown along the [0001] direction is that depending on the growth parameters such as growth temperature, pressure, and V/III ratio, inclined facets with respect to the (0001) plane also known as c-plane are obtained around the perimeter of the growing portions of c-plane semiconductor as defined by the open areas of the patterned mask. The inclined facets are generally oriented along the $\{1\bar{1}01\}$ or $\{1\bar{1}02\}$ planes of the wurtzite crystal and present reduced polarisation fields compared with c-plane surfaces (semi-polar surfaces).

It is an object of the present invention to provide an improved method for forming an LED precursor, as well as improved LED precursors which tackle at least one of the problems associated with prior art methods and arrays, or at least, provide a commercially useful alternative thereto.

SUMMARY OF THE DISCLOSURE

The present inventors have realised that SAG methods are highly dependent on the geometry of the layers/devices to be fabricated. As such, performing the same SAG fabrication processes on substrates with different mask geometries may result in undesirable local variations in doping profiles and layer compositions resulting from local variations in aperture size. Furthermore, there may also be variations in doping profiles and layer compositions over different substrates due to differences in layout. That is to say, the doping profiles/alloy composition for each layer of an LED device formed by SAG may be dependent on the geometry of the device. Consequently, small changes in geometry of a device, or an array of devices, may require the SAG process for each layer of the device to be calibrated again.

Furthermore, the present inventors have realised that during a SAG process, material from the mask layer may be incorporated into the deposited structure. For example, elements within the masking layer may diffuse into the material grown by SAG during fabrication, resulting in undesirable doping of the LED structures grown. In particular, masking layers including Si or O (e.g. $SiN_x$, $SiO_2$) may provide a source of Si or O dopants for Group III-nitride layers grown by SAG.

According to a first aspect of the disclosure, a method of forming a Light Emitting Diode precursor is provided. The method comprises:

(a) forming a first semiconducting layer comprising a Group III-nitride on a substrate, the first semiconducting layer having a growth surface on an opposite side of the first semiconducting layer to the substrate;

(b) selectively removing portions of the first semiconducting layer to form a mesa structure such that the growth surface of the first semiconducting layer comprises a mesa surface and a bulk semiconducting layer surface;

(c) forming a monolithic LED structure on the growth surface of the first semiconducting layer such that the monolithic LED structure covers the mesa surface and the bulk semiconducting surface, the monolithic LED structure comprising a plurality of layers, each layer comprising a Group III-nitride, including:
a second semiconducting layer;
an active layer provided on the second semiconducting layer, the active layer configured to generate light; and
a p-type semiconducting layer provided on the active layer,
wherein a potential barrier is provided between a first portion of the p-type semiconducting layer covering the mesa surface and a second portion of the p-type semiconducting layer covering the bulk semiconducting surface, the potential barrier surrounding the first portion of the p-type semiconducting layer covering the mesa surface.

In SAG methods, a monolithic LED structure can be grown on an exposed portion of a buffer layer. The monolithic LED structure is not grown on portions of the buffer layer covered by the mask layer. In the method of the first aspect, the monolithic LED structure is overgrown on the substrate, without the presence of a mask layer. As such, the method of fabricating the monolithic LED structure is a mask-less overgrowth method. Accordingly, a monolithic LED structure is formed on a growth surface of a first semiconductor layer. Thus, the layers of the monolithic LED structure are formed on the growth surface to cover the mesa surface and the bulk semiconducting surface of the first semiconductor layer.

The mesa structure formed on the growth surface helps to define the geometry of monolithic LED structure. Thus, in contrast to known SAG methods, no mask layer is needed to define apertures for selective growth of an LED structure. Rather, the monolithic LED structure is grown over the growth surface to cover the mesa structure. By covering the mesa structure, the monolithic LED structure formed may have inclined facets similar to monolithic LED structures grown by SAG methods known in the art.

Advantageously, the method of the first aspect allows a monolithic LED structure to be formed on a growth surface without the presence of a mask layer. Thus, the method of the first aspect reduces or eliminates problems associated with material recycling and mask layer contamination.

It will be appreciated that the method of the first aspect results in a monolithic LED structure having a substantially planar, upper surface surrounded by inclined sidewalls. As such, the monolithic LED structure may have a substantially trapezoidal cross section. Such trapezoidal cross sections may have increased light extraction efficiency, as the inclined sidewalls of the trapezoidal cross section may direct a greater proportion of light towards a light emitting surface of the LED precursors.

Furthermore, the method of the first aspect involves the formation of the layers of the monolithic LED structure across the growth surface, including the mesa surface and the bulk semiconducting surface. The layers of the monolithic LED structure may by formed using fabrication processes similar to SAG. However, in the method of the first aspect the layers of the monolithic LED structure are formed across the whole growth surface (i.e. no mask layer present). Thus, the formation of the layers of the monolithic LED structure are less sensitive to variations in the geometry of the LED precursor to be formed. Consequently, the method of forming an LED precursor may reduce or eliminate the calibration processes to be performed for forming the layers of the monolithic LED precursor each time the geometry of the device is changed.

In particular, in the method of the first aspect the geometry of the LED precursor may be influenced by the geometry of the mesa structure formed. For example, when forming LED precursors with trapezoidal cross sections, the height and surface area of the mesa structure may be varied in order to control a desired height and surface are of the LED precursor formed. As such, an aspect ratio of the LED precursor formed may be tuned using the selective removal step. The subsequent steps in which the monolithic LED structure is deposited over the mesa structure may be kept constant, regardless of LED precursor aspect ratio. By contrast, in a SAG process, changes to the aspect ratio of a trapezoidal cross section the LED structure may require one or more of the deposition steps to be recalibrated.

It will be appreciated that unlike SAG techniques, the monolithic LED structure is grown across the growth surface, including across the bulk semiconducting layer surface. To confine charge carriers within the portion of the monolithic LED structure defined by the mesa structure, a potential barrier is provided in the p-type layer of the monolithic LED structure. The p-type layer is provided between the first portion of the p-type semiconducting layer covering the mesa surface and a second portion of the p-type semiconducting layer covering the bulk semiconducting surface in order to confine charge carriers that flow through the first portion of the p-type layer (i.e. confine charge carriers within the mesa structure).

By the term "precursor" in LED precursor, it is noted that the LED precursor described does not necessarily include the electrical contacts for the LED such as to allow the emission of light, nor the associated circuitry. Of course, the method of forming the LED precursor of the first aspect does not preclude the addition of further electrical contacts and associated circuitry. As such use of the term precursor in this disclosure is intended to include the finalised product (i.e. a LED, a LED array etc.).

In some embodiments, the first semiconducting layer may be an n-type doped semiconducting layer. That is to say, the first semiconducting layer may comprise an electron donor dopant.

In some embodiments, the second semiconducting layer may be an n-type doped semiconducting layer. In some embodiments where the first semiconducting layer comprises is an n-type doped semiconducting layer, the second semiconducting layer may comprise a lower density of electron donors.

Alternatively, in some embodiments, the second semiconducting layer comprises an un-doped Group III-nitride. By providing the second semiconducting layer as an un-doped layer (i.e. not including any intentional doping) (or a lower charge carrier density), the resistivity of the resulting monolithic LED structure may be increased in sidewall regions of the LED structure. Accordingly, charge carriers may be more efficiently confined in the mesa structure, and through the plurality of layers provided on the mesa surface, thereby increasing the efficiency of the LED.

In some embodiments, the second semiconducting layer is formed on the growth surface to provide inclined sidewalls extending between a portion of the second semiconducting layer on the mesa surface of the first semiconducting layer and a portion of the second semiconducting layer on the bulk semiconducting surface of the first semiconducting layer. Accordingly, the second semiconducting layer can be overgrown on the mesa structure of the first semiconducting layer to provide a Group III-nitride semiconducting layer comprising a mesa surface and surrounded by inclined sidewalls on which an active layer of an LED may be formed. Importantly, this structure may be formed without the presence of a mask layer.

In some embodiments, the active layer is configured to generate light of a first wavelength. For example, the active layer may be configured to generate light having a wavelength of at least 400 nm. As such, the active layer may generate visible light suitable for use in a LED display. In some embodiment, the active layer may generate light having a wavelength of no greater than 700 nm. In some embodiments, the active layer may comprise a plurality of quantum wells (a multiple quantum well layer).

According to embodiments of the disclosure, the potential barrier in the p-type layer for confining charge carriers within the mesa structure may be provided in a number of ways.

In some embodiments, the p-type semiconducting layer comprises Al, and is formed such that a higher concentration of Al is incorporated into a sidewall portion of the p-type semiconducting layer than the first portion of the p-type semiconducting layer covering the mesa surface such that a potential barrier is provided between the first portion of the p-type semiconducting layer and the second portion of the p-type semiconducting layer.

In some embodiments, a portion of the p-type semiconducting layer encircling the first portion of the p-type semiconducting layer covering the mesa structure is selectively removed. For example, a portion of the p-type semiconducting layer may be selectively removed by etching. In some embodiments, the portion of the p-type semiconducting layer encircling the mesa structure which is selectively removed may only extend partially through the thickness of the p-type semiconducting layer. As such, the remaining portion of the p-type semiconducting layer may include a relatively thin section in with a higher resistance, thereby providing a potential barrier. In some embodiments, the portion of the p-type semiconducting layer encircling the mesa structure which is selectively removed may extend through at least the thickness of the p-type semiconducting layer. Accordingly, the potential barrier formed may be defined by the resulting void, or the void may be subsequently filled by an insulating material.

According to a second aspect of the disclosure a method of forming a LED array precursor is provided. The method comprises:

(a) forming a first semiconducting layer comprising a Group III-nitride on a substrate, the first semiconducting layer having a growth surface on an opposite side of the first semiconducting layer to the substrate;

(b) selectively removing portions of the first semiconducting layer to form a plurality of mesa structures such that the growth surface of the first semiconducting layer comprises a plurality of mesa surfaces and a bulk semiconducting layer surface;

(c) forming a monolithic LED array structure on the growth surface of the first semiconducting layer such that the monolithic LED array structure covers the mesa surfaces and the bulk semiconducting surface, the monolithic LED array structure comprising a plurality of layers, each layer formed from a Group III-nitride, including:

an n-type semiconducting layer;

an active layer provided on the n-type semiconducting layer, the active layer configured to generate light; and a p-type semiconducting layer provided on the active layer;

wherein a potential barrier is provided between each mesa portion of the p-type semiconducting layer covering each mesa surface and a bulk portion of the p-type semiconducting layer covering the bulk semiconducting surface, the potential barrier surrounding each mesa portion of the p-type semiconducting layer covering the mesa surface.

The method according to the second aspect of the disclosure provides a method of forming a plurality of monolithic LED structures on a substrate, wherein each of the monolithic structures formed is similar to those formed by the method of the first aspect of the disclosure. Accordingly, the method according to the second aspect may include all the important features as described above in relation to the first aspect.

By array, it is meant that a plurality of LEDs are formed, wherein the LEDs are intentionally spaced across the monolithic structure and typically form a regular array, such as hexagonally close-packed array or a square packed array of LEDs.

According to a third aspect of the disclosure, a LED precursor is provided. The LED precursor comprises a first semiconducting layer, and a monolithic LED structure. The first semiconducting layer comprises a Group III-nitride, the first semiconducting layer including a mesa structure extending from a major surface of the first semiconducting layer to define a growth surface including a bulk semiconductor surface and a mesa surface. The monolithic LED structure is provided on the growth surface of the first semiconducting layer such that the monolithic LED structure covers the mesa surface and the bulk semiconducting surface. The monolithic LED structure comprises a plurality of layers, each layer comprising a Group III-nitride, including an n-type semiconducting layer, an active layer provided on the n-type semiconducting layer, the active layer configured to generate light, and a p-type semiconducting layer provided on the active layer. A potential barrier is provided between a first portion of the p-type semiconducting layer covering the mesa surface and a second portion of the p-type semiconducting layer covering the bulk semiconducting surface, the potential barrier surrounding the first portion of the p-type semiconducting layer covering the mesa surface.

The LED precursor according to the third aspect provides an LED precursor which may be formed by the method of the first aspect. Accordingly, the LED precursor according to the third aspect may incorporate features corresponding to all of the important features of the first aspect described above.

In some embodiments, the height of the mesa structure (normal to the bulk semiconducting surface 26) is equal or larger than a cross-sectional width of the mesa surface. That is to say, in at least one plane normal to bulk semiconducting surface 26, the height of the mesa structure is equal or larger than a cross-sectional width of the mesa surface. As such, the height of the mesa structure relative to the cross-sectional width of the mesa structure may provide a LED precursor with an aspect ratio which is optimised to increase light extraction efficiency from the LED.

According to a fourth aspect of the disclosure, a LED array precursor is provided. The light emitting diode array precursor comprises a first semiconducting layer, and a monolithic LED array structure. The first semiconducting layer comprises a Group III-nitride, the first semiconducting layer including a plurality of mesa structures, each mesa structure extending from a major surface of the first semiconducting layer to define a growth surface including a bulk semiconductor surface and a plurality of mesa surfaces. The monolithic LED array structure is provided on the growth surface of the first semiconducting layer such that the monolithic LED array structure covers each of the mesa surfaces and the bulk semiconducting surface. The monolithic LED array structure comprising a plurality of layers, each layer comprising from a Group III-nitride, including an n-type semiconducting layer, an active layer provided on the n-type semiconducting layer, the active layer configured to generate light, and a p-type semiconducting layer provided on the active layer. A potential barrier is provided between mesa portions of the p-type semiconducting layer covering each of the mesa surfaces and a bulk portion of the p-type semiconducting layer covering the bulk semiconducting surface, the potential barrier surrounding each of the mesa portions of the p-type semiconducting layer covering the mesa surface.

The LED precursor array according to the fourth aspect provides an LED precursor array which may be formed by the method of the second aspect. Accordingly, the LED precursor array according to the fourth aspect may include a plurality of LEDs in accordance with the third aspect. Thus, the LED precursor array may incorporate features corresponding to all of the important features of the first aspect described above.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

According to an embodiment of this disclosure, a method of forming a LED 1 is provided. The method of forming the LED will now be described with reference to FIGS. 1-4.

Figure 1:
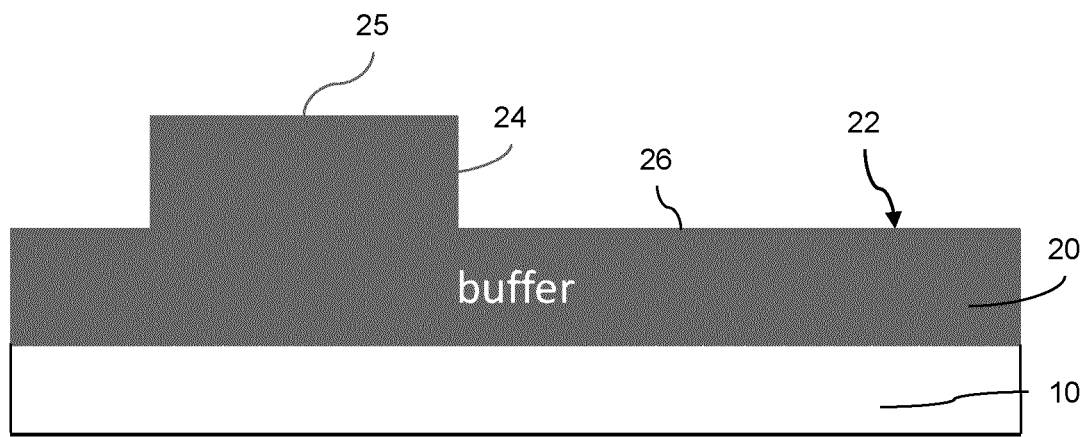
FIG. 1 shows a diagram of an intermediate step of a method according to an embodiment of the disclosure in which a first semiconducting layer including a mesa structure is provided.

As shown in FIG. 1, a substrate 10 may be provided for forming the LED thereon. The substrate may be any substrate 10 suitable for the formation of Group III-nitride electronic devices. For example, the substrate 10 may be a sapphire substrate, or a silicon substrate. The substrate may comprise one or more buffer layers configured to provide a substrate surface suitable for the formation of Group III-nitride layers.

A first semiconducting layer 20 may be formed on the substrate surface. The first semiconducting layer 20 comprises a Group III-nitride. In some embodiments, the first semiconducting layer may be n-type doped. In other embodiments, the semiconducting layer may not be intentionally doped.

For example, in the embodiment of FIG. 1, the first semiconducting layer 20 comprises GaN. The GaN may be n-typed doped using a suitable dopant, for example Si, or Ge. The first semiconducting layer 20 may be deposited using any suitable process for the fabrication of Group III-nitride thin films, for example, Metal Organic Chemical Vapour Deposition (MOCVD), or Molecular Beam Epitaxy (MBE). The first semiconducting layer 20 has a first surface which is a surface of the first semiconducting layer 20 on an opposite side of the first semiconducting layer 20 to the substrate 10. The first surface is used to form at least a portion of a growth surface 22 on which the layers of the LED structure are deposited.

In some embodiments, the first semiconductor layer 20 may be formed on the substrate with a (0001) crystal plane provided parallel to a surface of the substrate.

The growth surface 22 of the first semiconducting layer 20 may be subsequently shaped using a selective removal process. As such, portions of the first semiconducting layer 20 are selectively removed to form a mesa structure 24 such that the growth surface 22 of the first semiconducting layer 20 comprises a mesa surface 25 and a bulk semiconducting layer surface 26.

For example, in FIG. 1 the growth surface 22 may be shaped using an etching process. In the etching process, a mesa-defining mask layer (not shown) may be deposited on the first surface of the first semiconducting layer 20. The mesa-defining mask layer is configured to mask portions of the first semiconductor layer 20 which are intended to form mesa surfaces 25 of the growth surface. Un-masked portions of the first semiconducting layer 20 may then be selectively removed using an etchant. The etchant may etch away portion of the first semiconducting layer 20 to expose a bulk semiconducting layer surface 26 of the first semiconducting layer 20. That is to say, the etchant may not etch completely through the thickness of the first semiconducting layer 20 to expose the substrate 10 below. The mesa-defining mask layer may then be removed from the first semiconductor layer. By following the above process, the first semiconducting layer 20 may be shaped to provide a mesa structure 24 which is monolithically provided on a bulk semiconductor layer surface 26, for example as shown in FIG. 1.

In some embodiments, the mesa surface portion of the first semiconducting layer 20 may not be selectively removed. Accordingly, the alignment of the mesa surface 25 with respect to the substrate 10 may be unchanged following the selective removal step. As such, the mesa surface 25 may be parallel to a surface of the substrate. In some embodiments, the first semiconductor layer is etched such that the bulk semiconductor surface 26 is also substantially parallel to the substrate 10. Accordingly, the mesa surface 25 and the bulk semiconductor surface 26 of the first semiconductor layer 20 may both be surfaces which are substantially parallel to each other. In some embodiments, the mesa surface 25 and the bulk semiconductor surface 26 may be aligned with (0001) planes of the Group III-nitride forming the first semiconducting layer 20.

In FIG. 1, the mesa structure 24 is shown with sidewalls which are substantially perpendicular to the bulk semiconducting surface 26 and the mesa surface 25. In other embodiments, the mesa structures 24 may be formed with inclined sidewalls. For example, different etchants may be used to control the shape of the sidewalls formed during the selective removal process.

Next, a monolithic LED structure may be formed on the growth surface 22 of the first semiconductor layer 20. The monolithic LED structure covers the mesa surface 25 and the bulk semiconducting layer surface 26. The monolithic LED structure comprises a plurality of layers, wherein each layer comprises a Group III-nitride. In some embodiments, the Group III-nitrides comprise one of more of AlInGaN, AlGaN, InGaN and GaN.

A monolithic LED structure refers to the provision of an LED structure formed as a single piece. That is to say, the monolithic LED structure is formed as a single piece on the first semiconductor layer.

Figure 2:
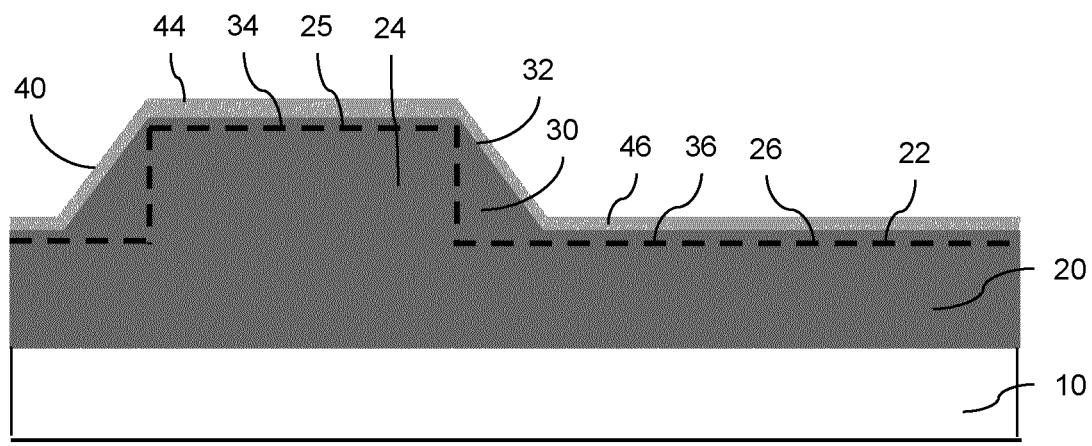
FIG. 2 shows a diagram of an intermediate step of a method according to an embodiment of the disclosure in which a first semiconducting layer with an overgrown second semiconducting layer is provided.

In one embodiment of the disclosure, as shown in FIG. 2, a second semiconducting layer 30 may be deposited on the first semiconducting layer 20. The second semiconducting layer 30 is formed on the first semiconducting layer 20 on an opposite side of the first semiconducting layer 20 to the substrate 10. As such, the second semiconducting layer 30 forms the first of the plurality of layers of the monolithic LED structure. For reference, FIG. 2 shows schematically the outline of the growth surface 22 of FIG. 1 as a dashed line.

The second semiconducting layer 30 may be formed on the growth surface 22 by any suitable growth method for the growth of Group III-nitrides. In the embodiment of FIG. 2, the second semiconducting layer 30 is formed monolithically over the growth surface 22 (i.e. an overgrowth method). The second semiconductor layer 30 may be formed as a continuous layer covering substantially the entire growth surface 22. The second semiconducting layer 30 may be deposited using any suitable process for the fabrication of Group III-nitride thin films, for example, Metal Organic Chemical Vapour Deposition (MOCVD), or Molecular Beam Epitaxy (MBE).

The second semiconducting layer 30 comprises a Group III-nitride. In the embodiment of FIG. 2, the second semiconducting layer 30 comprises GaN. The second semiconducting layer may be n-type doped. The GaN may be n-typed doped using a suitable dopant, for example Si, or Ge. In the embodiment of FIG. 2, the second semiconducting layer 30 is not intentionally doped. As such, the second semiconducting layer 30 may be a (substantially) undoped layer. By substantially undoped, it is understood that the Group III-nitride layer does not include any significant quantity of a dopant elements, whilst appreciating that some impurities may be present as a result of the fabrication process. As such, the substantially undoped Group III-nitride may be not intentionally doped. By forming the second semiconducting layer 30 from an undoped semiconductor, the flow of charge carriers through the LED may be more efficiently confined in the mesa structure 24.

By growing the second semiconducting layer 30 on the first semiconducting layer 20, the second semiconducting layer may have a crystal structure which corresponds to the crystal structure of the first semiconducting layer 20. For example, where the mesa surface 25 of the first semiconducting layer 20 is aligned with the (0001) plane of a Group III-nitride, the second semiconducting layer 30 may also be grown with a similar crystal orientation.

In the embodiment of FIG. 2, the second semiconducting layer 30 is formed on the growth surface 22 to provide an inclined sidewall portion 33 extending between a first portion of the second semiconducting layer 34 on the mesa surface 25 of the first semiconducting layer and a second portion of the second semiconducting layer 36 on the bulk semiconducting surface 26 of the first semiconducting layer. Accordingly, the second semiconducting layer 30 can be overgrown on the mesa structure 24 of the first semiconducting layer 20 to provide a Group III-nitride semiconducting layer comprising a second semiconducting layer mesa surface 35 and surrounded by inclined sidewall portions 33. As such, the second semiconductor layer 30 may be overgrown on the mesa structure 24 to form a column having a regular trapezoidal cross-section normal to the substrate, wherein the second semiconducting layer mesa surface 35 forms the substantially flat upper surface of the trapezoidal cross section. The second semiconducting layer mesa surface 35 may be aligned with plane parallel to the substrate surface on which the layers are formed.

By "regular trapezoidal cross-section" it is meant that the column is narrower at the top than the bottom and that it has a substantially flat upper surface, with sloped linear sides. This may result in a frustroconical shape, or more likely a frustropyramidal shaped having 3 or more sides, typically 6 sides. The description of "regular trapezoidal cross-section" refers to the first portion of the second semiconductor layer 34 grown over the mesa structure 24. The trapezoidal cross-section is the discontinuous portion of the second semiconductor layer extending above the continuous planar portion of the second semiconductor layer. The tapering sides of the trapezoidal cross section of the column are referred to herein as sidewall portions 33.

In some embodiments, the sidewall portions 33 of the columns have a substantially consistent angle ($\alpha$) to a plane parallel to the first semiconductor layer. That is, the angle between the side of the columns and a plane parallel to the first semiconductor does not change significantly. For example, the angle $\alpha$ is between 50° and 70°, more preferably it is between 58° and 64°, most preferably about 62°.

Accordingly, in some embodiments, the sidewall portions 33 of the columns may be inclined with respect to the (0001) plane of the crystal structure of the first semiconducting layer 20. The inclined sidewalls may generally be oriented along the $\{1\overline{1}01\}$ or $\{1\overline{1}02\}$ planes of the wurtzite crystal and present reduced polarisation fields compared with c-plane surfaces (semi-polar surfaces), similar to the structures produced by SAG.

In some embodiments, the column in the second semiconductor layer 30 is a truncated hexagonal pyramid.

As shown in FIG. 2, an active layer 40 may then be formed on the second semiconducting layer 30. The active layer 40 is configured to generate light of a first wavelength as part of the monolithic LED structure.

In the embodiment of FIG. 2, the active layer 40 may comprise one or more quantum well layers (not shown). As such, the active layer 40 may be a multiple quantum well layer. The quantum well layers within the active layer 40 may comprise a Group III-nitride semiconductor, preferably a Group III-nitride alloy including In. For example, in the embodiment of FIG. 2 the active layer 40 may comprise alternating layers of GaN and $In_zGa_{1-z}N$, where $0<Z\leq1$. The thickness and In content of the quantum well layer may be controlled in order to control the wavelength of light generated by the active layer. The active layer 40 may be formed as a continuous layer covering a substantial portion (e.g. all) of the exposed surface of the second semiconductor layer 30. The active layer 40 may be deposited using any suitable process for the fabrication of Group III-nitride thin films, for example, Metal Organic Chemical Vapour Deposition (MOCVD), or Molecular Beam Epitaxy (MBE).

The deposition of the active layer 40 on the second semiconductor layer 30 may occur with a relatively high deposition rate on the first portion of the second semiconducting layer 35 on the mesa surface 25, and with a significantly lower deposition rate on the inclined sidewalls. This effect results from the different crystal plane alignment of the various surfaces, resulting in a thicker active layer 40 over the mesa surface 25 than on the inclined sidewalls 35. This effect is described in more detail in GB1811190.6.

Figure 3:
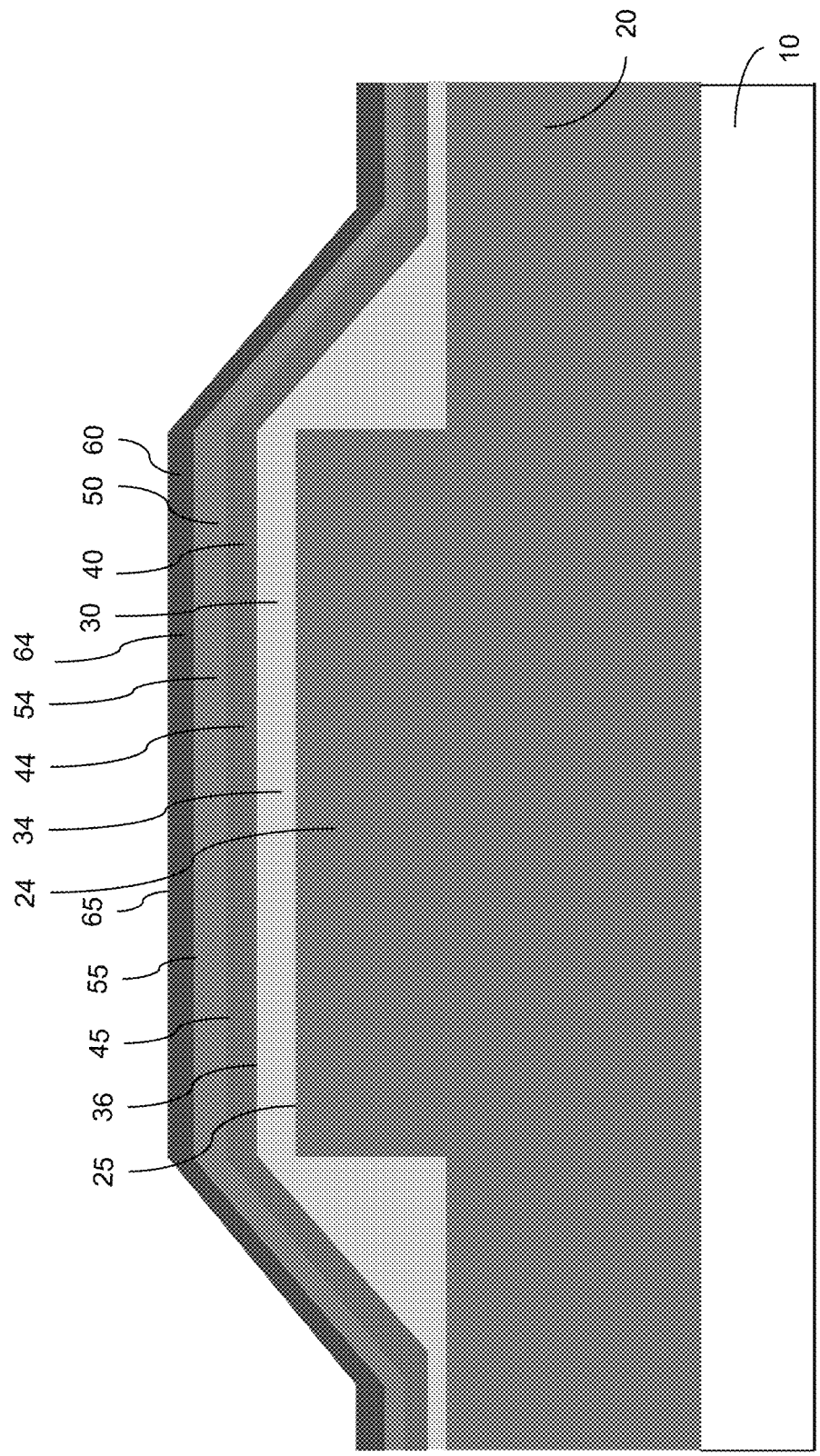
FIG. 3 shows a diagram of an intermediate step of a method according to an embodiment of the disclosure in which a monolithic LED structure is provided on a first semiconducting layer.

Further layers of the monolithic LED structure may then be deposited on the active layer 40 on an opposite side of the active layer 40 to the second semiconducting layer 30. FIG. 3 shows an example of a plurality of layers forming a monolithic LED structure which have been formed on a growth surface 22 of a first semiconducting layer 20. The plurality of layers of the monolithic LED structure may each be formed as a continuous layer.

In the embodiment of FIG. 3, a second semiconducting layer 30 comprising undoped GaN is formed on the first semiconducting layer 20. The first semiconducting layer in FIG. 3 comprises n-type doped GaN. An active layer 40 is provided on the second semiconducting layer 30 as described above.

In the embodiment of FIG. 3, an electron blocking layer 50 is provided on the active layer 40. The electron blocking layer 50 is provided on a side of the active layer 40 opposite to a side of the active layer on which the second semiconducting layer 30 is provided. The electron blocking layer 50 comprises a Group III-nitride. The electron blocking layer 50 may be formed as a continuous layer covering a substantial portion (e.g. all) of the exposed surface of the active layer 40. The electron blocking layer 50 is configured to reduce electron flow from the active layer 40 into the p-type semiconducting layer 60 of monolithic LED structure. For example, in the embodiment of FIG. 3, the electron blocking layer 50 may comprise $Al_xGa_{1-x}N$. Further details of suitable electron blocking layers 50 may be found in at least Schubert, E. (2006). Light-Emitting Diodes. Cambridge: Cambridge University Press.

As shown in FIG. 3, a p-type semiconducting layer 60 is provided over the active layer 40. The p-type semiconducting layer 60 is provided on a side of the electron blocking layer 50 opposite the side of the electron blocking layer 50 on which the active layer 40 is provided. The p-type semiconducting layer 60 comprises a Group III-nitride. The p-type semiconducting layer is doped with a suitable electron acceptor, for example Mg. The p-type semiconducting layer 60 may be formed as a continuous layer covering a substantial portion (e.g. all) of the exposed surface of the active layer 40 (or electron blocking layer 50 if present).

Accordingly, the p-type semiconducting layer 60 may be provided with a first portion 64 which is substantially aligned with the mesa structure 24. That is to say, a surface of the first portion of the p-type semiconducting layer 65 is aligned is provided over the mesa surface 25 (i.e. the centres of the respective surfaces are aligned). The p-type semiconducting layer 60 also comprises a second portion which covers at least a portion of the bulk semiconductor surface 26 away from the mesa surface 24. As such, the monolithic LED structure may generally be considered to have a first portion provided over the mesa surface 25 and a second portion which covers at least a portion of the bulk semiconductor surface 26 away from the mesa surface 24.

In order to improve charge carrier confinement in the active layer over mesa surface 25 of the LED, methods according to this disclosure form a potential barrier between first portion of the monolithic LED structure covering the mesa surface 25 and a second portion of the monolithic LED structure covering the bulk semiconducting surface 26, wherein the potential barrier surrounds the first portion of the p-type semiconducting layer covering the mesa surface 25. That is to say, methods according to this disclosure provide a potential barrier between an upper contact surface of the substantially flat surface of the regular trapezoidal shape and the layers formed over the bulk semiconducting surface 26.

Figure 4:
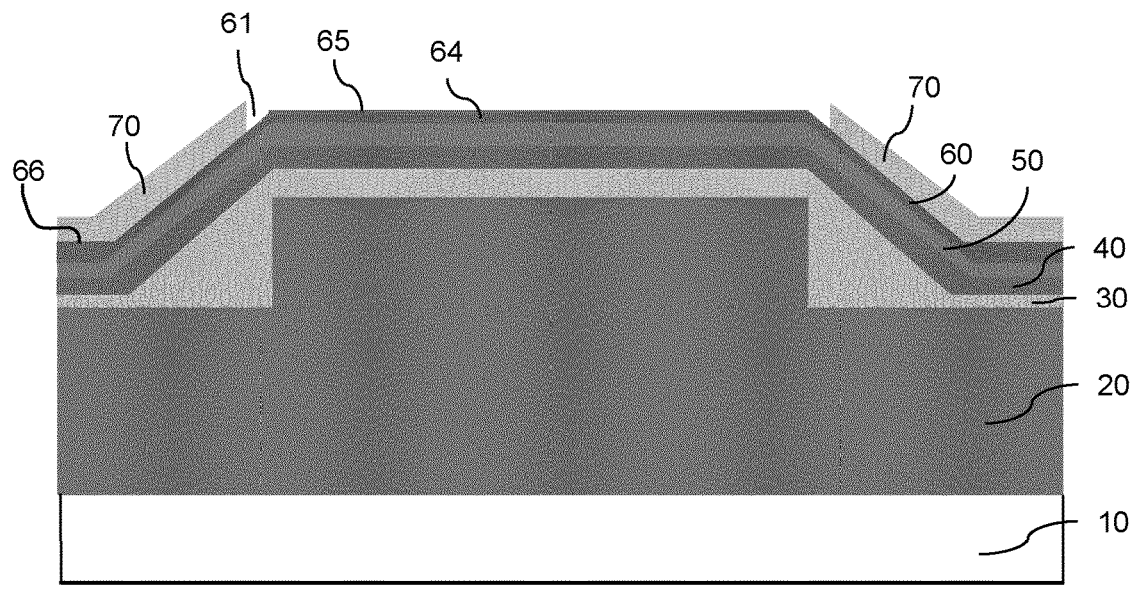
FIG. 4 shows a diagram of an intermediate step of a method according to an embodiment of the disclosure in which a mask layer is provided on the intermediate structure of FIG. 3

One method for forming such a potential barrier is shown in schematically in FIGS. 3 and 4. The embodiments of FIGS. 4 and 5 show further processing steps following fabrication of the device as shown in FIG. 3.

In FIG. 4, a mask layer 70 is formed on a surface of the p-type semiconducting layer 60 on an opposite side of the p-type semiconducting layer 60 to the electron blocking layer 50.

The mask layer 70 may be selectively provided on the p-type semiconducting layer 60. The mask layer 70 may be provided to define one or more apertures. The apertures may be configured to expose regions of the p-type semiconducting layer 60 which are to be selectively removed. For example, the apertures may define a third portion of the p-type semiconducting layer 61 encircling the first portion 64 of the p-type semiconducting layer covering the mesa structure. The third portion of the p-type semiconducting layer 61 may then be selectively removed, for example by etching, in order to provide the potential barrier. For example, in the embodiment of FIG. 4, the third portion of the p-type semiconducting layer 61 is an inclined sidewall portion of the p-type semiconducting layer 60.

Figure 5:
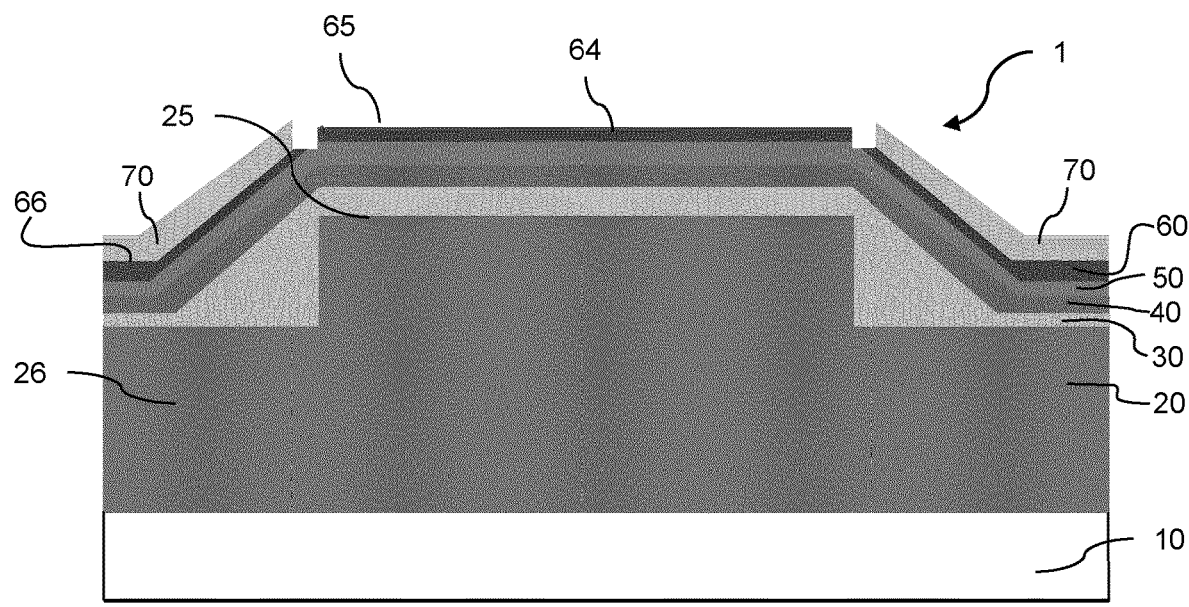
FIG. 5 shows a diagram of a LED precursor according to an embodiment of the disclosure.

In the embodiment of FIGS. 4 and 5, an anisotropic etchant may be used to selectively remove the third portion of the p-type semiconducting layer 61. An anisotropic etchant, for example KOH, may preferentially etch the inclined sidewall regions of a Group III-nitride at a faster rate than the planar surfaces aligned parallel with the substrate (for example surface aligned with a (0001) crystal plane). Accordingly, the mask layer 70 may be provided to define apertures which are aligned with, and expose, the surface of the first portion of the p-type semiconducting layer 65 and a third portion of the p-type semiconducting layer 61 corresponding to an inclined sidewall region of the p-type semiconducting layer 60. The anisotropic etchant may then preferentially etch the p-type semiconductor layer 60 in the inclined sidewall region at a significantly higher rate in order to remove the desired amount of material.

FIG. 5 shows a schematic diagram of the resulting LED precursor following the formation of a potential barrier by selective removal of the third portion of the p-type semiconducting layer 61. As shown in FIG. 5, the p-type semiconducting layer 60 is selectively removed through thickness of the layer to expose the layer below (the electron blocking layer 50 in the embodiment of FIG. 5). As such, the selective removal step forms a channel in the monolithic LED structure which encircles the first portion of the p-type semiconducting layer 64). Thus, a potential barrier is formed in the p-type semiconducting layer 60 between a first portion of the p-type semiconducting layer 65 covering the mesa surface 25 and a second portion of the p-type semiconducting layer 66 covering the bulk semiconducting surface 26. The potential barrier is provided in order to increase confinement of charge carriers in the active layer mesa structure region of the device during operation.

In other embodiments of methods according to this disclosure, the depth of the channel which is selectively removed may be varied. For example, in some embodiments, the channel may only extend partially through the thickness of the third portion of the p-type semiconducting layer 61. By reducing the thickness of the third portion of the p-type semiconducting layer 61, in combination with the variation in deposition rate of the monolithic LED structure on the sidewall surface noted above, the remaining part of the third portion of the p-type semiconducting layer 61 may be present a significant resistance between the first and second portions of the p-type semiconducting layer 65, 66, such that a potential barrier is effectively provided. In other embodiments, the channel may extend, at least partially, through the thickness of one or more of the other layers of the monolithic LED structure.

Figure 6:
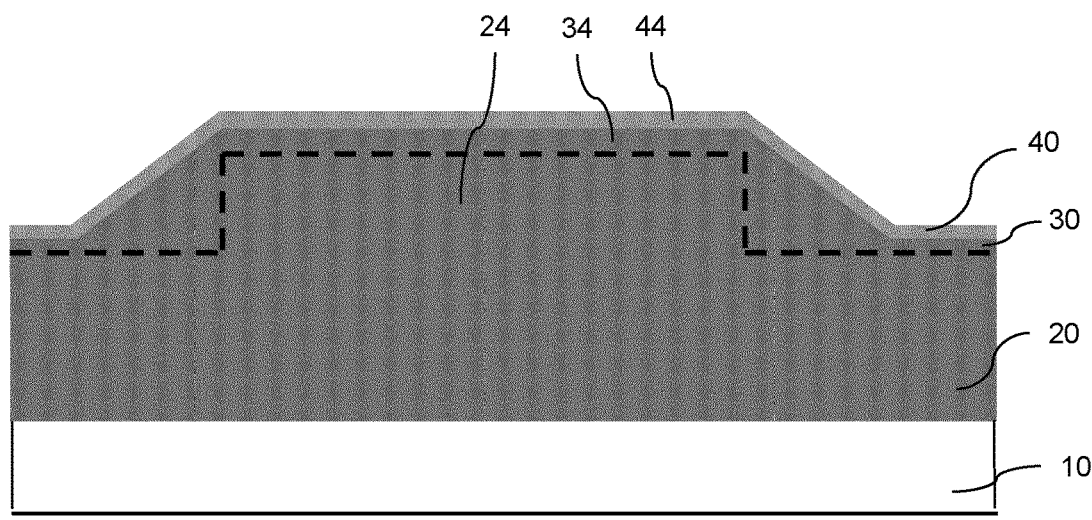
FIG. 6 shows a diagram of an intermediate step of a method according to an embodiment of the disclosure in which a monolithic LED structure is provided on a first semiconducting layer
Figure 7:
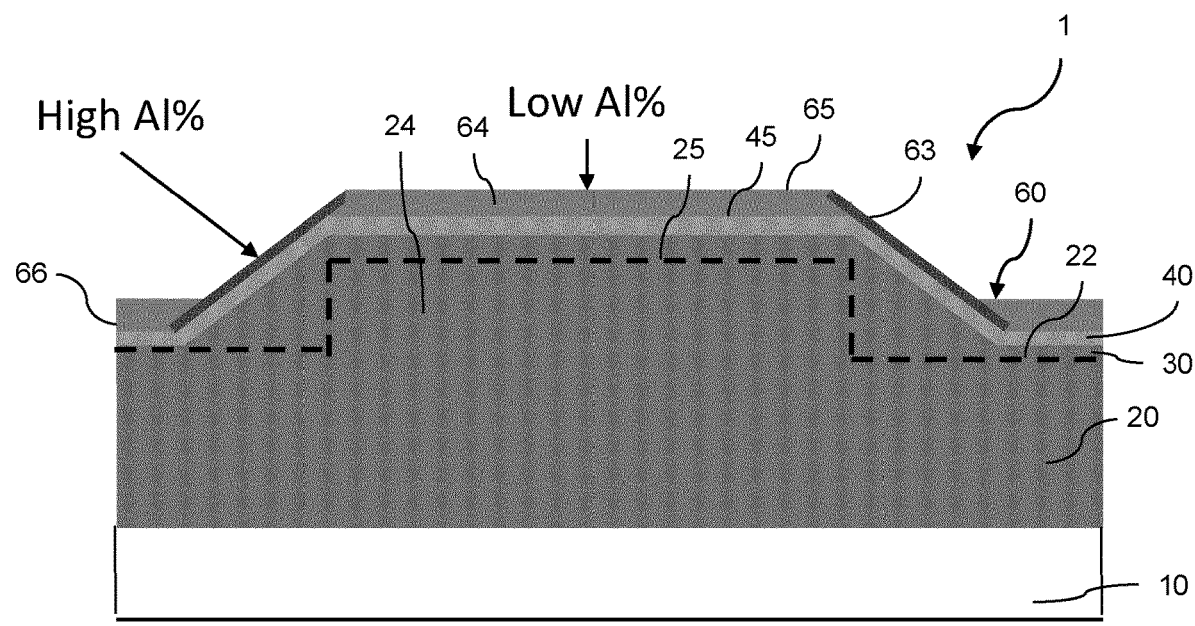
FIG. 7 shows a diagram of a LED precursor according to another embodiment of the disclosure.

A further method for forming such a potential barrier is shown in schematically in FIGS. 6 and 7.

FIG. 6 shows a structure comprising a first semiconducting layer 20, a second semiconducting layer 30, and an active 40. The structure of FIG. 6 may be formed by the method steps as discussed above in relation to FIGS. 1-3.

Following the forming of the structure of FIG. 6, a p-type semiconducting layer 60 is formed on the active layer 40, as shown in FIG. 7. The p-type semiconducting layer 60 is formed on an opposite side of the active layer 40 to the second semiconducting layer 30. In some embodiments, an electron blocking layer 50 may be provided between the p-type semiconducting layer 60 and the active layer 40 as shown in FIG. 3.

In the embodiment of FIG. 7, the p-type semiconducting layer 60 comprises a Group III-nitride including Al. The p-type semiconducting layer 60 may be formed such that a higher concentration of Al is incorporated into a sidewall portion 63 of the p-type semiconducting layer than a first portion of the p-type semiconducting layer 64 covering the mesa surface 25 such that a potential barrier is provided between the sidewall portion of the p-type semiconducting layer 63 and the first portion of the p-type semiconducting layer 64. The difference in Al composition between the sidewall portion 63 and the first portion of the p-type semiconducting layer 64 may be such that the change in bandgap between the first portion and the sidewall portion is larger than kT eV at room temperature (i.e. greater than about 0.26 eV).

For example, the sidewall portion of p-type semiconducting layer 63 may comprise p-type $Al_xGa_{1-x}N$, wherein $2 \leq x \leq 50\%$, and the first portion of the p-type semiconducting layer 64 may comprise p-type $Al_yGa_{1-y}N$, wherein $1 \leq y \leq 15\%$.

As discussed above, the inclined sidewalls of the second semiconducting layer 30 result in a variation in the deposition rate of Group III-nitrides depending on whether the growth surface is an inclined sidewall, or substantially parallel to the substrate. For growth of the p-type semiconducting layer 60, the difference in growth rates also affects the incorporation of Al into the p-type semiconducting layer 60. Accordingly, the inclined sidewall portions 63 may be formed with a higher Al content than the first portion 64 using the same deposition process. As such, the desired potential barrier for confining current in the first portion of the p-type semiconducting layer 64 of the monolithic LED structure may be formed without any further patterning steps.

As described above, a LED precursor may be provided having a plurality of layers.

The first semiconducting layer 20 may have a thickness between 100 nm and 8 μm and preferably between 3 μm and 5 μm. Portions of the first semiconducting layer 20 may be selectively removed to define a mesa structure having a height normal to the bulk semiconducting surface 26 of at least: 100 nm, 200 nm 300 nm or 500 nm. The mesa structure may have a height of no greater than 5 μm. In some embodiments the mesa structure may have a height between 1 μm and 3 μm.

The second semiconducting layer 30 may have a thickness of at least 5 nm on the mesa surface 24 of the first semiconducting layer 20. The second semiconducting layer 30 may have a thickness of no greater than 4 μm.

The substantially flat first portion 34 of the active layer 40 may have a thickness between 30 nm and 150 nm and in some embodiments between 40 nm and 60 nm.

The substantially flat first portion 44 of the electron blocking layer 50 may have a thickness between 5 nm and 50 nm and in some embodiments between 20 nm and 40 nm. For example, in the embodiment of FIG. 3, the electron blocking layer may have a thickness of 33 nm. Due to variations in the deposition rate, as discussed above, the thickness of the electron blocking layer 50 in the sidewall regions of the electron blocking layer 50 may have a thickness of at least 0.5 nm up to around 25 nm. For example, in the embodiment of FIG. 3, the electron blocking layer 50 may have a thickness in the sidewall region of about 7 nm.

The substantially flat first portion 64 of the p-type semiconducting layer 60 may have a thickness of at least: 50 nm, 60 nm 70 nm, 80 nm, 90 nm or 100 nm. The substantially flat first portion 64 of the p-type semiconducting layer 60 may have a thickness of no greater than: 300 nm, 250 nm, or 200 nm. For example, in the embodiment of FIG. 3, the substantially flat first portion 64 of the p-type semiconducting layer 60 may have a thickness of about 100 nm.

In some embodiments, the height of the mesa structure (normal to the bulk semiconducting surface 26) is equal or larger than a cross-sectional width of the mesa surface. That is to say, in at least one plane normal to bulk semiconducting surface 26, the height of the mesa structure is equal or larger than a cross-sectional width of the mesa surface. As such, the height of the mesa structure relative to the cross-sectional width of the mesa structure may provide a LED precursor with an aspect ratio which is optimised to increase light extraction efficiency from the LED.

For example, in some embodiments, a mesa surface 25 may be provided having a surface area of no greater than 100 μm×100 μm. In particular, a mesa surface may have a surface area of no greater than 4 μm×4 μm. Accordingly, a height of the mesa structure may be at least 4 μm.

Following the formation of the LED precursor as described above, the LED precursor may undergo further processing steps in order to provide a LED. For example, in some embodiments, the substrate 10 may be removed, in order to expose a light emitting surface 21 of the first semiconducting layer 20.

Preferably, light extraction features such as a lens (i.e. dome-shaped surface) may also be provided on the light emitting surface. For example, a lens (or other dome-shaped structure may be formed on the light emitting surface 21 in order to increase the light extraction efficiency from the LED. In some embodiments, a lens is aligned with each LED on the light emitting surface 21. Each lens may cover a surface area of the light emitting surface 21 corresponding to a surface area of the base of the monolithic LED structure (i.e. a base of the trapezoidal shape). In some embodiments, the lens (dome shaped surface) may be formed by the light emitting surface 21 through selective removal of the first semiconducting layer 20 from the light emitting surface 21.

By providing the light emitting surface 21 of the LED with a light extracting feature, the light extraction efficiency of the LED may be increased.

In accordance with an embodiment of the disclosure, a light emitting diode precursor 1 is provided. The LED precursor comprises a first semiconducting layer 20, a second semiconducting layer 30, an active layer 40, and a p-type semiconducting layer 60.

The first semiconducting layer 20 comprises a Group III-nitride. As shown in FIG. 3, the first semiconducting layer 20 may be provided on a substrate 10. The substrate 10 may comprise sapphire, silicon or SiC. The substrate 10 may comprise one or more buffer layers configured to provide a substrate surface suitable for the formation of Group III-nitride layers. Of course, in some embodiments, the LED precursor 1 may be fabricated in accordance with the methods described above, after which the substrate 10 may be removed. In some embodiments the LED precursor 1 may be bonded to a backplane electronic substrate (not shown). The backplane electronic substrate may comprise electrical circuitry and contacts configured to control and make contact to the LED precursor 1. In some embodiments, the backplane electronic substrate may be bonded to the p-type semiconducting layer 60.

In accordance with the FIGS. 5 and 7, the first semiconducting layer 20 includes a mesa structure 24 extending from a major surface of the first semiconducting layer 20 to define a growth surface 22 including a bulk semiconductor surface 26 and a mesa surface 25. By major surface, it is understood to mean a surface of the first semiconducting layer 20 forming a substantial part of the total surface area of the first semiconducting layer 20. For example, in FIGS. 5 and 7, the major surface forming the growth surface 22 is the surface of the first semiconducting layer 20 provided on an opposite side of the first semiconducting layer 20 to the substrate 10.

Figure 8:
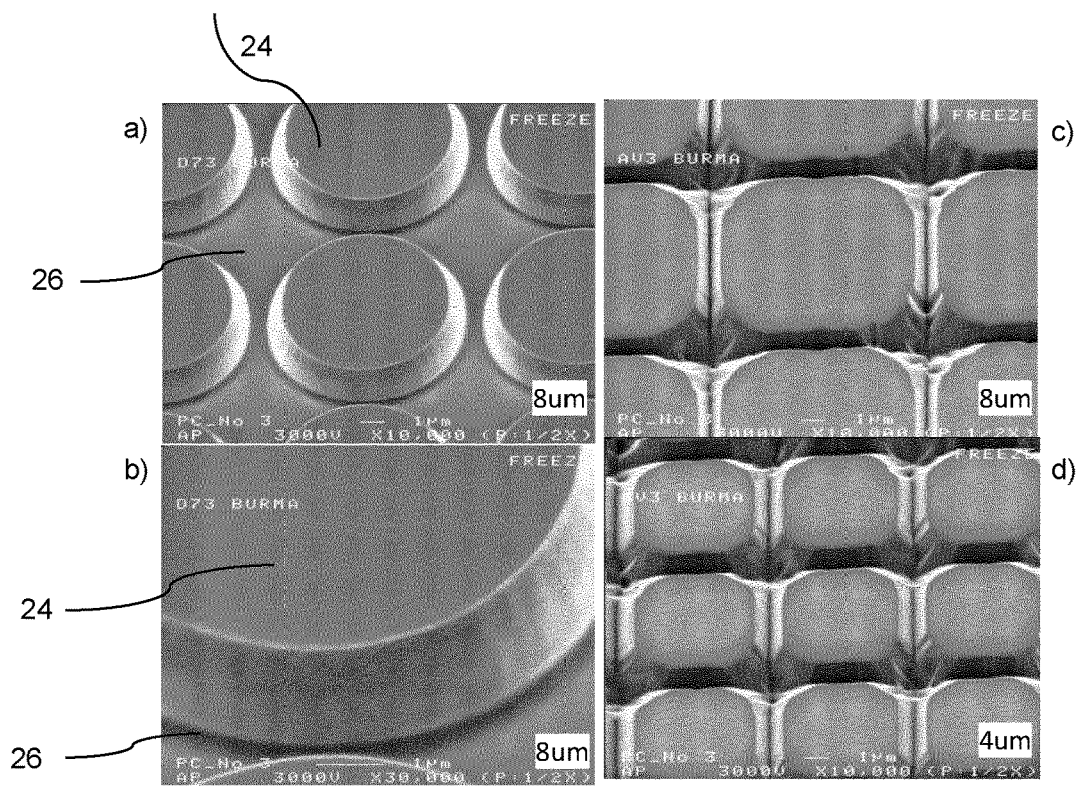
FIGS. 8a and 8b show SEM images of mesa structures of a first semiconductor layer.
FIGS. 8c and 8d show SEM images of an overgrown monolithic LED array structure.

The mesa structure 24 may be considered to be a column extending from the bulk semiconductor surface 26 of the first semiconducting layer 20. The mesa structure 24 is formed monolithically with the bulk semiconductor surface 26 of the first semiconducting layer 20, for example as described in the methods above. The mesa structure 24 may me a column having any cross-sectional shape (i.e. the shape of the column when viewing the first semiconducting layer 20 in plan view). For example, the mesa structure 24 may be a column having a regular polygon cross section. In particular, the mesa structure 24 may be an elliptical (or circular) column, a rectangular column, or a hexagonal column. FIG. 8a shows one example of a plurality of mesa structures 24 of a first semiconducting layer 20, wherein each mesa structure 24 is a circular column.

In the embodiments shown in FIGS. 5 and 7, the mesa structures 24 are shown in with sidewalls which are substantially perpendicular to the bulk semiconducting surface 26 and the mesa surface 25. In other embodiments, the mesa structures 24 may be formed with inclined sidewalls.

As shown in FIGS. 5 and 7, a monolithic LED structure is provided on the growth surface 22 of the first semiconducting layer 20 such that the monolithic LED structure covers the mesa surface 25 and the bulk semiconducting surface 26.

As described above, the monolithic LED structure comprises a plurality of layers. Each layer is formed from a Group III-nitride. The monolithic LED structure comprises a second semiconducting layer 30, an active layer 40, and a p-type semiconducting layer 60. In some embodiments, the monolithic LED structure may also comprise an electron blocking layer 50.

As discussed above, the second semiconducting layer 30 is provided on the growth surface 22 to provide inclined sidewalls 33 extending between a first portion of the second semiconducting layer 34 on the mesa surface 25 of the first semiconducting layer and a second portion of the second semiconducting layer 36 on the bulk semiconducting surface 26 of the first semiconducting layer 20. Accordingly, the second semiconducting layer 30 is overgrown on the mesa structure 24 of the first semiconducting layer 20 to provide a Group III-nitride semiconducting layer comprising a first portion 34 and surrounded by inclined sidewalls 33. As such, the second semiconductor layer 30 may be overgrown on the mesa structure 24 to form a column having a regular trapezoidal cross-section normal to the substrate with a surface of the first portion of the second semiconductor layer 35 being substantially flat. The substantially flat surface of the first portion 35 may be in a plane parallel to the substrate surface on which the layers are formed.

The active layer 40, electron blocking layer 50 (if present), and the p-type semiconducting layer 60 may be provided on the second semiconducting layer 30 in accordance with the methods described above to form a monolithic LED structure. Example of such monolithic LED structures may also be seen in at least FIGS. 5 and 7.

In order to improve charge carrier confinement in the active layer over mesa surface 25 of the LED, LED precursors according to this disclosure comprise a potential barrier between a first portion of the monolithic LED structure covering the mesa surface 25 and a second portion of the monolithic LED structure covering the bulk semiconducting surface 26, wherein the potential barrier surrounds the first portion of the p-type semiconducting layer covering the mesa surface 25. That is to say, methods according to this disclosure provide a potential barrier between the substantially flat surface of the regular trapezoidal shape and the layers formed over the bulk semiconducting surface 26.

As shown in FIGS. 5 and 7, the monolithic LED structure is formed such that a potential barrier is provided between a first portion of the p-type semiconducting layer covering the mesa surface 64 and a second portion of the p-type semiconducting layer covering the bulk semiconducting surface 66, the potential barrier surrounding the first portion of the p-type semiconducting layer 64 covering the mesa surface.

In the embodiment of FIG. 5, the potential barrier may be formed by selectively removing a third portion of the p-type semiconducting layer 61 encircling the first portion of the p-type semiconducting layer covering the mesa surface 64. As shown in FIG. 5, the p-type semiconducting layer 60 is selectively removed through thickness of the layer to expose the layer below (the electron blocking layer 50 in the embodiment of FIG. 5).

In the embodiments of FIG. 7, the potential barrier may be formed by providing the p-type semiconducting layer 60 comprising a Group III-nitride including Al. The p-type semiconducting layer 60 is provided such that a higher concentration of Al is incorporated into a sidewall portion 63 of the p-type semiconducting layer than a first portion of the p-type semiconducting layer 64 covering the mesa surface 25 such that a potential barrier is provided between the sidewall portion of the p-type semiconducting layer 63 and the first portion of the p-type semiconducting layer 64. The difference in Al composition between the sidewall portion 63 and the first portion of the p-type semiconducting layer

64 may be such that the change in bandgap is larger than kT eV at room temperature (i.e. greater than about 0.26 eV).

For example, the sidewall portion of p-type semiconducting layer may comprise p-type $Al_xGa_{1-x}N$, wherein 2×50%, and the mesa surface portion of the p-type semiconducting layer 65 may comprise p-type $Al_yGa_{1-y}N$, wherein 1≤y≤15%.

As discussed above, the inclined sidewalls 33 of the second semiconducting layer 30 result in a variation in the deposition rate of Group III-nitrides depending on whether the growth surface is an inclined sidewall, or substantially parallel to the substrate. For growth of the p-type semiconducting layer 60, the difference in growth rates also affects the incorporation of Al into the p-type semiconducting layer 60. Accordingly, the inclined sidewall portions of the p-type semiconducting layer 63 may be formed with a higher Al content than the first portion of the p-type semiconducting layer 65 using the same deposition process. As such, the desired potential barrier for confining current in the first portion of the monolithic LED structure may be formed without any further patterning steps.

Accordingly, a LED precursor according to an embodiment of the disclosure may be provided.

According to another embodiment of the disclosure, a method of forming a LED array precursor may be provided.

According to the method, a first semiconducting layer 20 comprising a Group III-nitride is formed on a substrate 10. The first semiconducting layer has a growth surface 22 on an opposite side of the first semiconducting layer 20 to the substrate 10. As such, the first semiconducting layer 20 may be formed in substantially the same method as described above for the embodiments of FIGS. 1-5 and FIGS. 6-7.

Next, portions of the first semiconducting layer 20 are selectively remove to form a plurality of mesa structures 24 such that the growth surface 22 of the first semiconducting layer 20 comprises a plurality of mesa surfaces 25 and a bulk semiconducting layer surface 26. As such, this step of the method is substantially the same as the corresponding step of the method of forming a LED precursor, except that a plurality of mesa structures 24 are formed.

The plurality of mesa structures 24 may be regularly spaced apart across the substrate growth surface 22 of the first semiconducting layer 20. For example, the mesa structures may be provided in a hexagonally close-packed array or a square packed array of mesa structures 24. FIG. 8a shows a Scanning Electron Micrograph (SEM) image of a first semiconductor layer including a plurality of mesa structures 24. As shown in FIG. 8a, a plurality of mesa structures 24 are provided as part of the first semiconducting layer 20. Each of the mesa structures 24 is a column with a cylindrical shape (a circular cross section). FIG. 8b shows a magnified view of one of the mesa structures 24 shown in FIG. 8a.

A monolithic LED array structure is then formed on the growth surface of the first semiconducting layer 20 such that first portions of the monolithic LED array structure cover a respective mesa surface 25 and a second portion of the monolithic LED array structure covers the bulk semiconducting surface 26. The monolithic LED array structure comprises a plurality of layers. Each layer is formed from a Group III-nitride. The monolithic array structure includes a second semiconducting layer 30, an active layer 40 provided on the second semiconducting layer 30, and a p-type semiconducting layer 60 provided on the active layer 40. In some embodiments, the monolithic LED structure may also comprise an electron blocking layer 50 provided between the active layer 40 and the second semiconducting layer 60.

A monolithic LED array structure refers to the provision of a LED array structure formed as a single piece. That is to say, the monolithic LED array structure is formed as a single piece on the first semiconductor layer.

The layers of the monolithic LED array structure may be provided using substantially the same process as described above for the method of forming an LED precursor. It will be appreciated that substantially the same processes for forming a monolithic LED array structure/monolithic LED structure may be used regardless of the number or shape of the LEDs being fabricated. As such, the overgrowth method of this disclosure provides a method of forming of an LED array precursor in which a substantial part of the fabrication process is independent of the geometry of the LED array.

Figure 9:
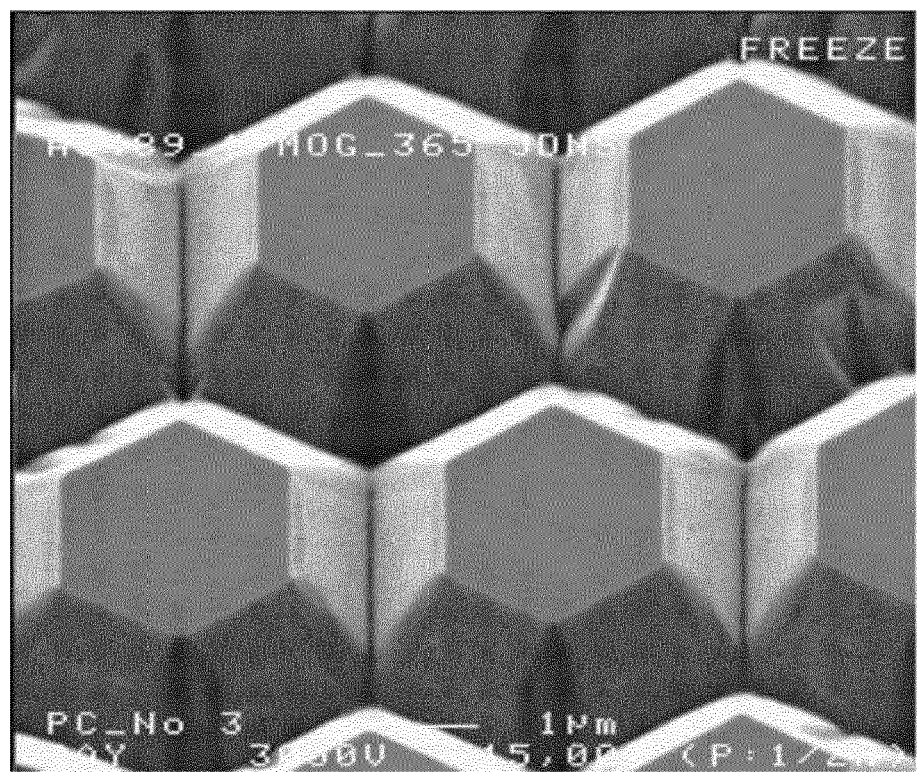
FIG. 9 shows an SEM image of an overgrown monolithic LED array structure having a hexagonal packing pattern

FIGS. 8c and 8d show SEM images of a plurality of mesa structures with an overgrown monolithic LED array structure. The monolithic LED array structure has been formed on a plurality of mesa structures 24 similar to those shown in FIG. 8a. In FIGS. 8a-8d, the mesa structures 24 are formed in a square packed array pattern. FIG. 9 shows an SEM image of a further array of mesa structures with an overgrown monolithic LED array structure. In FIG. 9, the mesa structures 24 are arranged in a hexagonally close-packed array pattern in order to provide the array structure shown.

Figure 10:
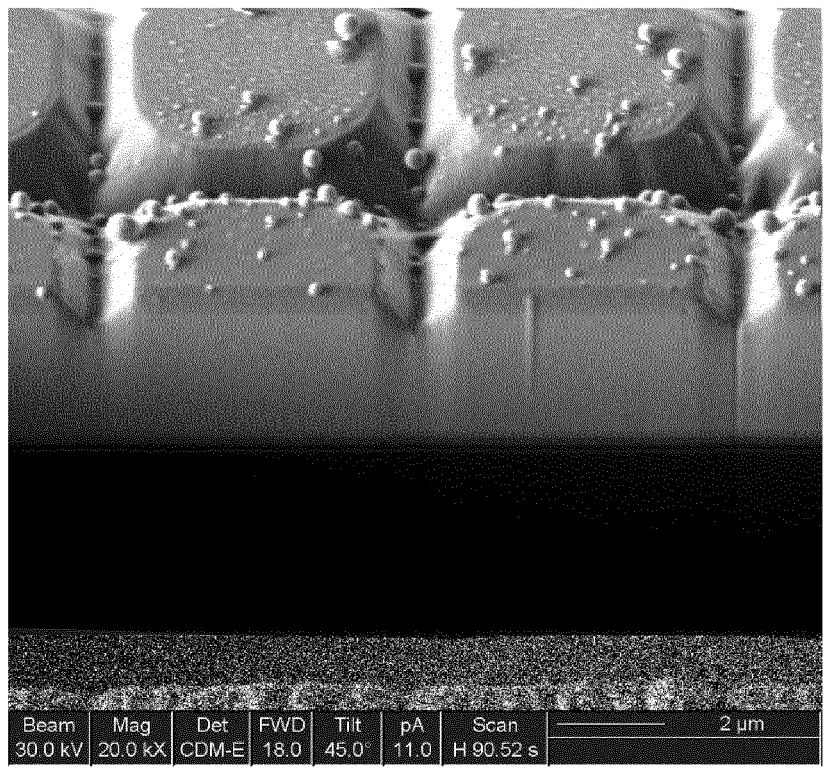
FIG. 10 shows a sectional SEM image of a first semiconducting layer including a plurality of mesa structures and an overgrown second semiconducting layer.
Figure 11:
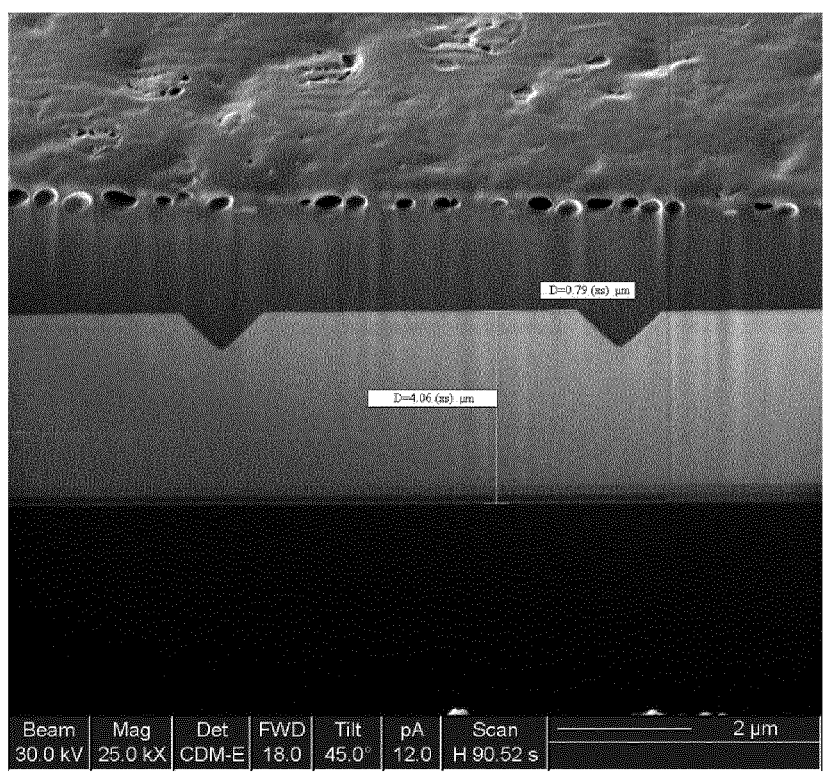
FIG. 11 shows a further sectional SEM image of a first semiconducting layer including a plurality of mesa structures and an overgrown second semiconducting layer.

In some embodiments, the second semiconducting layer 30 may comprise the same material as the first semiconducting layer 20. For example, the first and second semiconducting layer 20, 30 may comprises GaN which is n-type doped with Si. Accordingly, the second semiconducting layer 30 may be formed monolithically on the growth surface 22 of the first semiconducting layer with substantially the same lattice constant. The resulting structure formed may have a substantially continuous crystal structure at the interface between the first and second semiconducting layer 20, 30. FIGS. 10 and 11 shows SEM images of first and second semiconducting layer 20, 30 formed according to methods of this disclosure. In the SEM images of the FIGS. 10 and 11, the interface between the mesa structure 24 of the first semiconducting layer 20 and the second semiconducting layer 30 is not detected.

A potential barrier is provided between each first portion of the p-type semiconducting layer 64 covering each mesa surface 25 and a bulk portion of the p-type semiconducting layer 66 covering the bulk semiconducting surface 26. The potential barrier surrounds each first portion of the p-type semiconducting layer 64 covering the respective mesa surfaces 25.

In order to improve charge carrier confinement in the active layer 40 over each mesa surface 25 of each LED, a potential barrier is formed in each LED between a first portion of the monolithic LED structure covering the mesa surface 25 and a second portion of the monolithic LED structure covering the bulk semiconducting surface 26, wherein the potential barrier surrounds the first portion of the p-type semiconducting layer covering the mesa surface 25. That is to say, methods according to this disclosure provide a potential barrier between upper contact surfaces of the substantially flat surfaces of the regular trapezoidal shape and the layers formed over the bulk semiconducting surface 26.

The potential barrier for each monolithic LED structure of the LED array may be formed in a number of ways. For example, the potential barrier for each monolithic LED structure may be formed substantially as described in above with reference to FIG. 5 or substantially as described above with reference to FIG. 7.

For the embodiment of FIG. 5, the potential barriers may be formed by selectively removing a portion third of the p-type semiconducting layer 61 encircling each first portion of the p-type semiconducting layer covering the mesa surface 64. As shown in FIG. 5, the p-type semiconducting layer 60 is selectively removed through thickness of the layer to expose the layer below (the electron blocking layer 50 in the embodiment of FIG. 5).

For the embodiment of FIG. 7, the potential barrier may be formed by providing the p-type semiconducting layer 60 comprising a group III-nitride including Al. The p-type semiconducting layer 60 is provided such that a higher concentration of Al is incorporated into sidewall portions of the p-type semiconducting layer 63 than a first portion of the p-type semiconducting layer 64 covering the mesa surface 25 such that a potential barrier is provided between the sidewall portion of the p-type semiconducting layer 63 and the first portion of the p-type semiconducting layer 64. The difference in Al composition between the sidewall portion 63 and the first portion of the p-type semiconducting layer 64 may be such that the change in bandgap is larger than kT eV at room temperature (i.e. greater than about 0.26 eV).

Accordingly, a LED array precursor is provided.

The LED array precursor comprises a first semiconducting layer 20, a second semiconducting layer 30, an active layer 40 and a p-type semiconducting layer 60.

The first semiconducting layer 20 comprises a Group III-nitride. As shown in FIG. 3, the first semiconducting layer 20 may be provided on a substrate 10. The substrate 10 may comprise sapphire, silicon or SiC. The substrate 10 may comprise one or more buffer layers configured to provide a substrate surface suitable for the formation of Group III-nitride layers. Of course, in some embodiments, the LED array precursor may be fabricated in accordance with the methods described above, after which the substrate 10 may be removed. In some embodiments the LED array precursor may be bonded to a backplane electronic substrate. The backplane electronic substrate may comprise electrical circuitry and contacts configured to control and make contact to the LEDs of the LED array precursor. In some embodiments, the backplane electronic substrate may be bonded to the p-type semiconducting layer 60. As such, the first semiconducting layer may be provided substantially in accordance with the methods outlined above.

Similar to the embodiments shown in FIGS. 5 and 7, the first semiconducting layer 20 includes a plurality of mesa structures 24 extending from a major surface of the first semiconducting layer to define a growth surface 22 including a bulk semiconductor surface 26 and a mesa surface 25. As discussed above, an example of a first semiconducting layer comprises a plurality of mesa structures 24 is shown in FIG. 8a Similar to the embodiments shown in FIGS. 5 and 7, a monolithic LED array structure is provided on the growth surface 22 of the first semiconducting layer 20 such that the monolithic LED array structure covers the mesa surfaces 25 and the bulk semiconducting surface 26. As discussed above, an example of a monolithic LED array structure is shown in FIGS. 8c and 8d.

As described above, the monolithic LED array structure comprises a plurality of layers. Each layer is formed from a Group III-nitride. The monolithic LED array structure comprises a second semiconducting layer 30, an active layer 40, and a p-type semiconducting layer 60. In some embodiments, the monolithic LED array structure may also comprise an electron blocking layer 50. Each of the layers of the monolithic LED array structure may be formed as a continuous layer. As such, each of the layers of the monolithic LED array structure may be provided in a similar manner to the monolithic LED structure discussed above. Example of such monolithic LED structures may also be seen in at least FIGS. 5 and 7.

In order to improve charge carrier confinement in the active layer over each mesa surface 25 of the LED array precursor, each LED precursors of the array comprises a potential barrier between a first portion of each monolithic LED structure covering a respective mesa surface 25 and a second portion of each monolithic LED structure covering the bulk semiconducting surface 26, wherein the potential barrier surrounds the first portion of each p-type semiconducting layer covering the respective mesa surface 25. That is to say, methods according to this disclosure provide a potential barrier between each substantially flat surface of the regular trapezoidal shapes and the layers formed over the bulk semiconducting surface 26.

With reference to FIGS. 5 and 7, each monolithic LED array structure is formed such that a potential barrier is provided between first portions of the p-type semiconducting layers covering the mesa surfaces 64 and a second portion of the p-type semiconducting layer covering the bulk semiconducting surface 66, the potential barrier surrounding the first portions of the p-type semiconducting layer covering the mesa surfaces 65.

With reference to FIG. 5 and the above description, the potential barriers may be formed by selectively removing third portions of the p-type semiconducting layer 61 encircling the first portions of the p-type semiconducting layer covering the mesa surfaces 64. As shown in FIG. 5, the p-type semiconducting layer 60 may be selectively removed through thickness of the layer to expose the layer below (the electron blocking layer 50 in the embodiment of FIG. 5).

With reference to FIG. 7, the potential barrier may be formed by providing the p-type semiconducting layer 60 comprising a group III-nitride including Al. The p-type semiconducting layer 60 is provided such that a higher concentration of Al is incorporated into sidewall portions 63 of the p-type semiconducting layer 60 than the first portions of the p-type semiconducting layer 64 covering the mesa surfaces 25 such that potential barriers are provided between the sidewall portions of the p-type semiconducting layer 63 and the first portions of the p-type semiconducting layer 65 for each LED precursor in the LED array precursor. The difference in Al composition between the sidewall portions 63 and the first portions 64 of the p-type semiconducting layer may be such that the change in bandgap is larger than kT eV at room temperature (i.e. greater than about 0.26 eV).

For example, the sidewall portions of p-type semiconducting layer 63 may comprise p-type $Al_xGa_{1-x}N$, wherein $2 \times 50\%$, and the mesa surface portion of the p-type semiconducting layer 65 may comprise p-type $Al_yGa_{1-y}N$, wherein $1 \leq y \leq 15\%$.

As discussed above, the inclined sidewalls of the second semiconducting layer 30 result in a variation in the deposition rate of Group III-nitrides depending on whether the growth surface is an inclined sidewall, or substantially parallel to the substrate. For growth of the p-type semiconducting layer 60, the difference in growth rates also affects the incorporation of Al into the p-type semiconducting layer 60. Accordingly, the inclined sidewall portions 63 may be formed with a higher Al content than the first portions of the p-type semiconducting layer 65 using the same deposition process. As such, the desired potential barrier for confining current in the mesa surface portion of the monolithic LED structure may be formed without any further patterning steps.

Accordingly, a LED precursor according to an embodiment of the disclosure may be provided.

The invention claimed is:

1. A method of forming a Light Emitting Diode (LED) precursor comprising:
   (a) forming a first semiconducting layer comprising a Group III-nitride on a substrate, the first semiconducting layer having a growth surface on an opposite side of the first semiconducting layer to the substrate;
   (b) selectively removing a portion of the first semiconducting layer to form a mesa structure such that the growth surface of the first semiconducting layer comprises a mesa surface and a bulk semiconducting surface;
   (c) forming a monolithic LED structure on the growth surface of the first semiconducting layer such that the monolithic LED structure covers the mesa surface and the bulk semiconducting surface, the monolithic LED structure comprising a plurality of layers, each layer comprising a Group III-nitride, including:
      a second semiconducting layer;
      an active layer provided on the second semiconducting layer, the active layer configured to generate light; and
      a p-type semiconducting layer provided on the active layer,
   wherein a potential barrier is provided between a first portion of the p-type semiconducting layer covering the mesa surface and a second portion of the p-type semiconducting layer covering the bulk semiconducting surface, the potential barrier surrounding the first portion of the p-type semiconducting layer covering the mesa surface; and
   wherein the second semiconducting layer is formed on the growth surface to provide an inclined sidewall portion extending between a first portion of the second semiconducting layer on the mesa surface of the first semiconducting layer and a second portion of the second semiconducting layer on the bulk semiconducting surface of the first semiconducting layer.

2. The method of claim 1, wherein the second semiconducting layer comprises an un-doped Group III-nitride.

3. The method of claim 1, wherein the p-type semiconducting layer comprises Al, and is formed such that a higher concentration of Al is incorporated into an inclined sidewall portion of the p-type semiconducting layer than the first portion of the p-type semiconducting layer covering the mesa surface such that the potential barrier is formed in the inclined sidewall portion of the p-type semiconducting layer between the first portion of the p-type semiconducting layer and the second portion of the p-type semiconducting layer.

4. The method of claim 3 wherein the inclined sidewall portion of the p-type semiconducting layer comprises p-type $Al_xGa_{1-x}N$, wherein $2 \leq x \leq 50\%$; and
   the first portion of the p-type semiconducting layer comprises p-type $Al_yGa_{1-y}N$, wherein $1 \leq y \leq 15\%$.

5. The method of claim 1, wherein a portion of the p-type semiconducting layer encircling the first portion of the p-type semiconducting layer covering the mesa surface is selectively removed to expose the active layer below.

6. The method of claim 5, wherein the portion of the p-type semiconducting layer encircling the first portion of the p-type semiconducting layer covering the mesa surface is selectively removed using an anisotropic etchant.

7. The method of claim 1, wherein selectively removing portions of the first semiconducting layer to form the mesa structure comprises:
   selectively forming a mesa-defining mask layer on the first surface;
   selectively removing unmasked portions of first semiconducting layer to expose the bulk semiconducting surface of the first semiconductor layer; and
   removing the mesa-defining mask layer.

8. The method of claim 1, wherein the first semiconducting layer comprises GaN, wherein optionally the first semiconducting layer is an n-type semiconductor.

9. The method of claim 1, wherein a height of the mesa structure between the mesa surface and the bulk semiconducting surface is at least 200 nm.

10. A method of forming a LED array precursor comprising
    (a) forming a first semiconducting layer comprising a Group III-nitride on a substrate, the first semiconducting layer having a growth surface on an opposite side of the first semiconducting layer to the substrate;
    (b) selectively removing portions of the first semiconducting layer to form a plurality of mesa structures such that the growth surface of the first semiconducting layer comprises a plurality of mesa surfaces and a bulk semiconducting surface;
    (c) forming a monolithic LED array structure on the growth surface of the first semiconducting layer such that the monolithic LED array structure covers the mesa surfaces and the bulk semiconducting surface, the monolithic LED array structure comprising a plurality of layers, each layer comprising a Group III-nitride, including:
       an n-type semiconducting layer;
       an active layer provided on the n-type semiconducting layer, the active layer configured to generate light; and
       a p-type semiconducting layer provided on the active layer;
    wherein a potential barrier is provided between a mesa portion of the p-type semiconducting layer covering each mesa surface and a bulk portion of the p-type semiconducting layer covering the bulk semiconducting surface, the potential barrier surrounding each mesa portion of the p-type semiconducting layer covering the mesa surface; and
    wherein the n-type semiconducting layer is formed on the growth surface to provide a plurality of inclined sidewall portions, each inclined sidewall portion extending between portions of the n-type semiconducting layer on the mesa surface of the first semiconducting layer and a second portion of the n-type semiconducting layer on the bulk semiconducting surface of the first semiconducting layer.

11. A light emitting diode (LED) precursor comprising:
    a first semiconducting layer comprising a Group III-nitride, the first semiconducting layer including a mesa structure extending from a major surface of the first semiconducting layer to define a growth surface including a bulk semiconductor surface and a mesa surface;
    a monolithic LED structure provided on the growth surface of the first semiconducting layer such that the monolithic LED structure covers the mesa surface and the bulk semiconducting surface, the monolithic LED structure comprising a plurality of layers, each layer formed comprising a Group III-nitride, including:
       an n-type semiconducting layer;

an active layer provided on the n-type semiconducting layer, the active layer configured to generate light; and a p-type semiconducting layer provided on the active layer;

wherein a potential barrier is provided between a first portion of the p-type semiconducting layer covering the mesa surface and a second portion of the p-type semiconducting layer covering the bulk semiconducting surface, the potential barrier surrounding the first portion of the p-type semiconducting layer covering the mesa surface; and wherein the n-type semiconducting layer comprises an inclined sidewall portion extending between a first portion of the n-type semiconducting layer on the mesa surface of the first semiconducting layer and a second portion of the n-type semiconducting layer on the bulk semiconducting surface of the first semiconducting layer.

12. The LED precursor of claim 11, wherein:

the p-type semiconducting layer comprises Al, wherein:

an inclined sidewall portion of the p-type semiconducting layer comprises a higher concentration of Al than the first portion of the p-type semiconducting layer covering the mesa surface such that a potential barrier is formed in the inclined sidewall portion of the p-type semiconducting layer between the first portion of the p-type semiconducting layer and the second portion of the p-type semiconducting layer.

13. The LED precursor of claim 11, wherein a portion of the p-type semiconducting layer encircling the first portion of the p-type semiconducting layer covering the mesa structure is selectively removed to expose the active layer below.

14. The LED precursor of claim 11, wherein a height of the mesa structure between the mesa surface and the bulk semiconducting layer surface is at least 200 nm.

15. The LED precursor of claim 11, wherein a surface area of the mesa surface is no greater than 100 μm×100 μm.

16. The LED precursor of claim 11, wherein a height of the mesa structure between the mesa surface and the bulk semiconducting layer surface is at least equal to a cross-sectional width of the mesa surface of the mesa structure.

17. The LED precursor of claim 11, wherein the light emitting diode is provided as part of a LED array precursor, wherein the first semiconducting layer includes a plurality of mesa structures, each mesa structure extending from a major surface of the first semiconducting layer to define a growth surface including a bulk semiconductor surface and a plurality of mesa surfaces;

wherein a monolithic LED array structure is provided on the growth surface of the first semiconducting layer such that the monolithic LED array structure covers each of the mesa surfaces and the bulk semiconducting surface, wherein the potential barrier is provided between a mesa portion of the p-type semiconducting layer covering each of the mesa surfaces and a bulk portion of the p-type semiconducting layer covering the bulk semiconducting surface, the potential barrier surrounding each of the mesa portions of the p-type semiconducting layer covering the mesa surface.

* * * * *